US006204117B1

(12) United States Patent
Chiou et al.

(10) Patent No.: US 6,204,117 B1
(45) Date of Patent: Mar. 20, 2001

(54) REMOVAL OF SILICON OXYNITRIDE ON A CAPACITOR ELECTRODE FOR SELECTIVE HEMISPHERICAL GRAIN GROWTH

(75) Inventors: Jung-Chao Chiou, Hsin-Chu; Chuan-Fu Wang, San-Chung, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/352,471

(22) Filed: Jul. 14, 1999

(51) Int. Cl.[7] ............................................. H01L 21/8242
(52) U.S. Cl. ................................................ 438/253; 438/255
(58) Field of Search ................................. 438/253–256, 438/396–399

(56) References Cited

U.S. PATENT DOCUMENTS 5,766,995 * 6/1998 Wu ........................................ 438/255
6,037,220 * 3/2000 Chien et al. ........................... 438/255

* cited by examiner

Primary Examiner—Jey Tsai (57) ABSTRACT

A method of forming a capacitor for a dynamic random access memory (DRAM) cell using a selective hemispherical grain (s-HSG) structure after the removal of SiON by phosphoric acid ($H_3PO_4$) is disclosed. The method includes: Providing a semiconductor substrate having a semiconductor structure formed thereon; forming an interlayer dielectric layer over the semiconductor structure; patterning the interlayer dielectric layer; depositing an amorphous-silicon (a-Si) layer over the interlayer dielectric layer; depositing a SiON layer on the a-Si layer; patterning the SiON layer and the a-Si layer layer; removing the SiON layer by $H_3PO_4$ wet etching; forming a s-HSG silicon layer over the patterned a-Si layer; depositing a conformal interpoly dielectric layer along a surface of the resulting structure; and finally forming a polysilicon layer over the interpoly dielectric layer.

23 Claims, 7 Drawing Sheets

REMOVAL OF SILICON OXYNITRIDE ON A CAPACITOR ELECTRODE FOR SELECTIVE HEMISPHERICAL GRAIN GROWTH

BACKGROUND OF THE INVENTION

1. Field of the Invention

The present invention relates to the field of integrated circuits, and more particularly, to a method of forming a capacitor of a DRAM cell using a hemispherical grain structure after the removal of silicon oxynitride.

2. Description of the Prior Art

Since the creation of the first integrated circuit in 1960, the density that can be fabricated on semiconductor substrates has steadily increased. In the late 1970s the number of devices manufactured on a chip exceeded the generally accepted definition of "very large scale integration, or VLSI", that is more than 100,000 devices per chip. By 1990 this number had grown to more than 32 million devices per chip (16 Mbit DRAM), and it is generally acknowledged that the era of "ultra-large-scale integration, or ULSI" has begun.

Figure 1A:
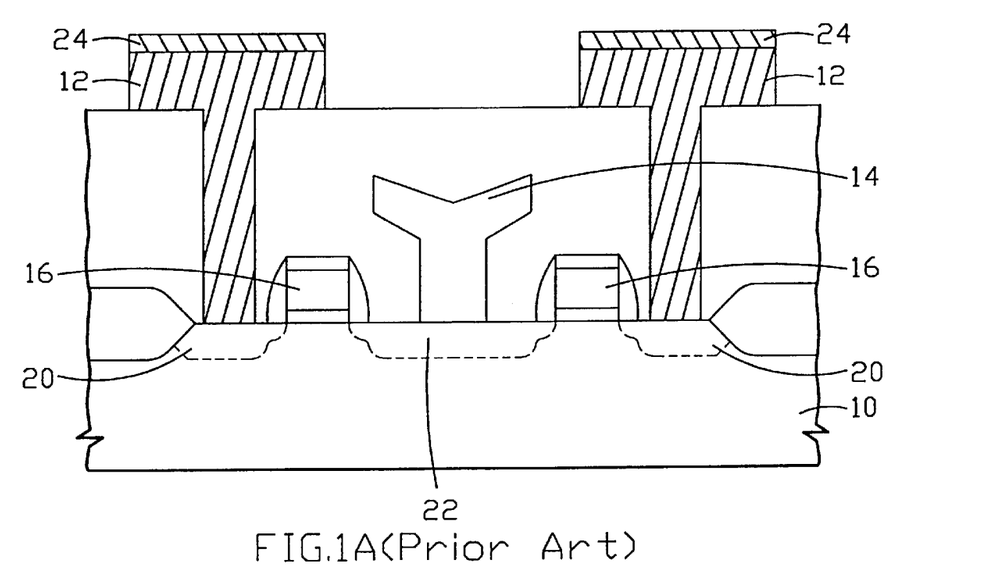
FIG. 1A shows a typical memory cell for each bit in a DRAM having a SiON layer formed over a lower capacitor electrode in cross-sectional views.

A typical memory cell for each bit in a DRAM is shown in FIG. 1A, which includes a semiconductor substrate 10 having a lower capacitor electrode 12, a bit line 14, a gate electrode 16, a source region 20, a drain region 22, etc. formed thereon. In effect, a DRAM memory cell is formed by a combination of a transistor, a capacitor and contacts to peripheral circuitry.

The advent of ULSI technologies has significantly and continuously decreased in size of memory cells used to manufacture integrated circuits. The reduction in the space available to imprint integrated circuits has in turn caused a reduction in the capacitor area, which further in turn, affects the reduction in the cell capacitance. In addition, the size of a chargeable space capable of being stored by the capacitor also decreases. The consequence of the reduction in the dimension of a semiconductor die causes the fabrication of a capacitor susceptible to particle interference.

Figure 1B:
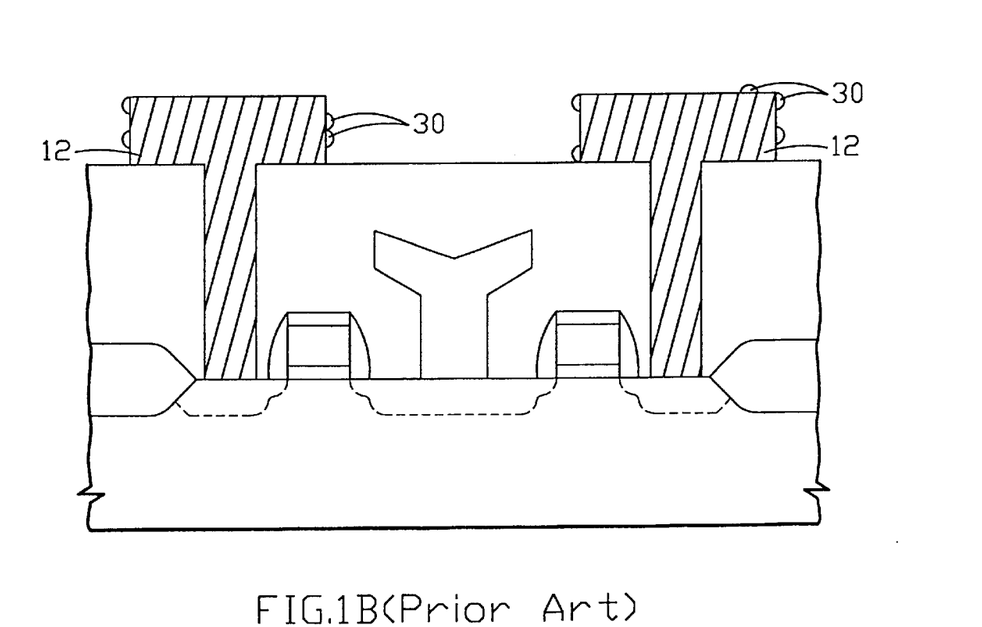
FIG. 1B shows the phenomena of HSG-Si loss or an incomplete HSG-Si coverage over a surface of the lower capacitor electrode after the removal of the SiON layer by conventional dry etching methods; and FIG. 2A to FIG. 2K depicts the process flow of a preferred embodiment according to the present invention in cross-sectional views.

Several DRAM cells have been developed to overcome such problems. For example, a capacitor with a hemispherical grain (HSG) silicon storage node has been developed to increase the surface area of the capacitor electrode. The HSG-Si is deposited by a low-pressure chemical vapor deposition (LPCVD) method at a transition temperature from amorphous-Si to polycrystalline-Si. Nevertheless, before the deposition of HSG-Si, for giga bit DRAM using 0.18 um technology and below, a silicon oxynitride (SiON) layer 24 (shown in FIG. 1A) is preferred as photo bottom anti-reflection coating (BARC) and etching hard mask for high aspect ratio stack capacitor formation. However, the removal of the SiON layer by conventional dry etching methods would destroy the structure of and induce HSG-Si loss on an amorphous silicon surface. That is, a problem associated with HSG grain adhesion reliability has been introduced. For example, as illustrated in FIG. 1B, the phenomena of HSG-Si loss or an incomplete HSG-Si coverage 30 over the surface of the lower capacitor electrode 12 is shown.

SUMMARY OF THE INVENTION

In accordance with the present invention, a method is provided for forming a capacitor of a DRAM cell using a hemispherical grain structure after a removal of a silicon oxynitride (SiON) layer by phosphoric acid ($H_3PO_4$) that substantially enhances the adhesion ability of the SiON layer onto amorphous-silicon surface. This new method is capable in overcoming all the drawbacks of the conventional methods by preserving their advantages as well.

In achieving the above objective and in accordance with the purpose of the present invention, as embodied and broadly described herein. An embodiment of the present invention includes a method of forming a capacitor, which comprises the steps of: Providing a semiconductor substrate having a semiconductor body formed thereon; forming a first insulating layer over the semiconductor body; patterning the first insulating layer to define a contact hole for the capacitor; depositing a first conductive layer over the first insulating layer and filling up the contact hole; forming a SiON layer on the first conductive layer; patterning the SiON layer and the first conductive layer to form a lower capacitor electrode; removing the SiON layer to expose the entire upper surface of the lower capacitor electrode; forming a second conductive layer over the entire exposed surface of the lower capacitor electrode; forming a second insulating layer along a surface of the resulting structure; and finally forming a third conductive layer over the second insulating layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 2A–2K, the process flow of a preferred embodiment according to the present invention is depicted in cross-sectional views. These drawings merely show several key steps in sequential processes.

Figure 2A:
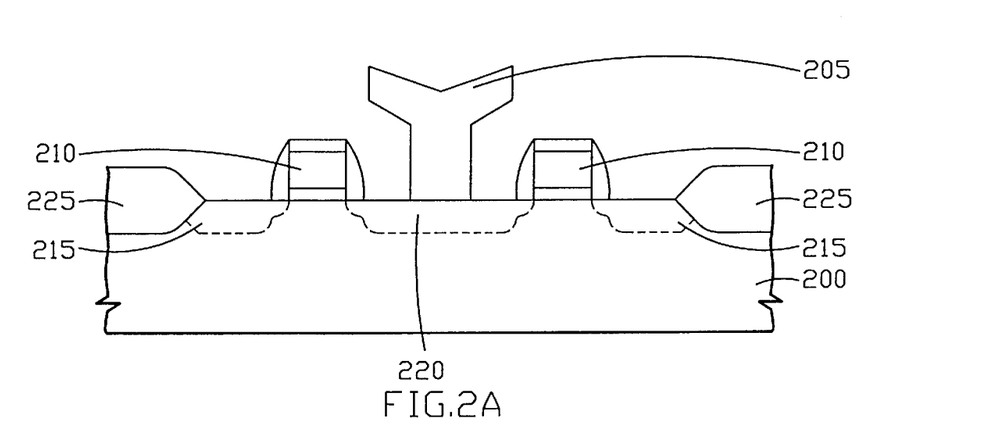

A method of forming a capacitor for a dynamic random access memory (DRAM) cell using a selective hemispherical grain (s-HSG) structure after the removal of SiON comprises the followings. First of all, as illustrated in FIG. 2A, a silicon semiconductor substrate 200 having a semiconductor structure formed thereon is provided. The semiconductor structure comprises a bit line 205, a gate electrode 210, a source region 215, a drain region 220, and an isolation region 225.

Figure 2B:
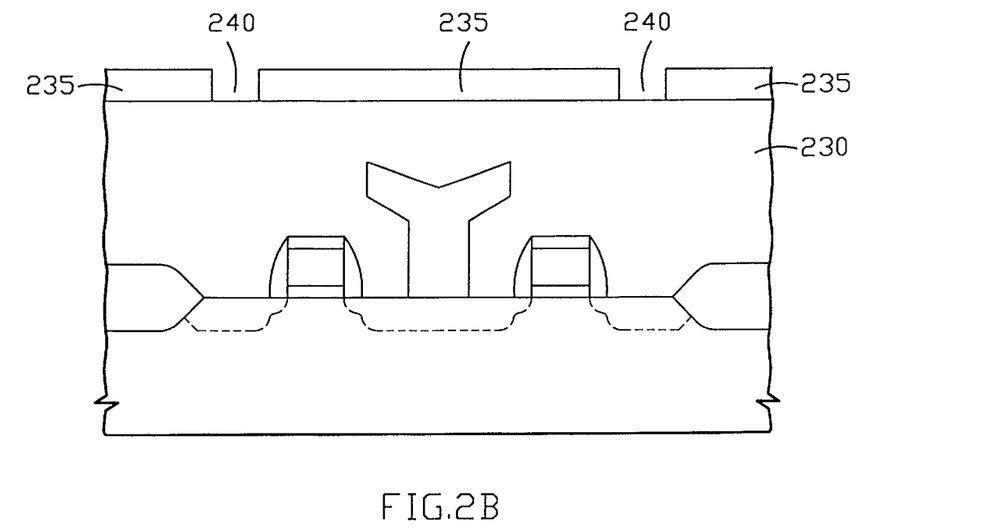

Next, in FIG. 2B, a silicon dioxide ($SiO_2$) interlayer dielectric layer 230 is deposited above the silicon semiconductor substrate and overlaying the semiconductor structure. A first patterned photoresist layer 235 having a contact hole 240 is formed over the interlayer dielectric layer 230. The contact hole is conventionally fabricated by creating a photolithographic mask containing a pattern of a defined location of a stack capacitor to be fabricated, coating the wafer with a light-sensitive material called photoresist or resist, exposing the resist-coated wafer to ultraviolet light through the mask to soften or harden parts of the resist depending on whether positive or negative resist is used, removing the softened parts of the resist, and ending up with the first patterned photoresist layer 235.

Figure 2C:
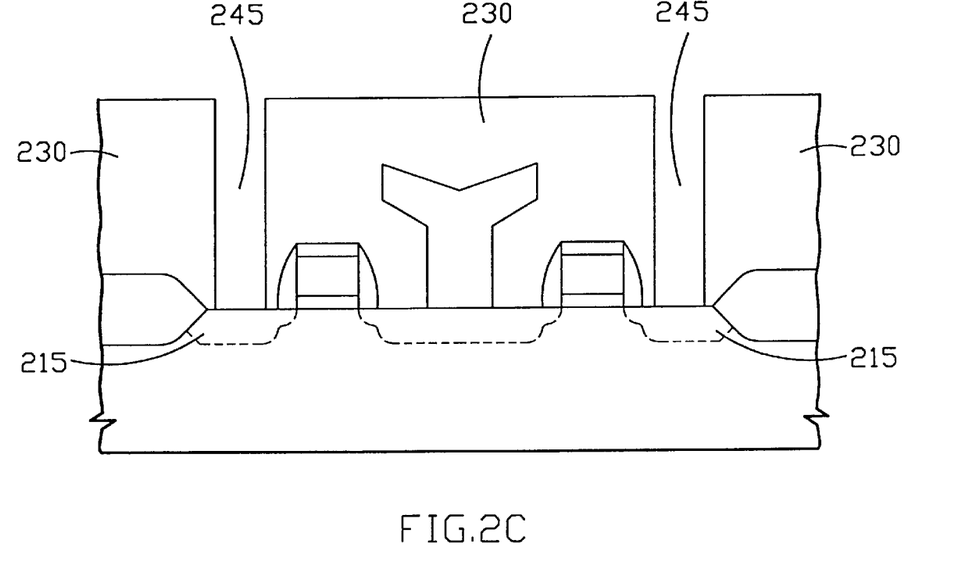
Figure 2D:
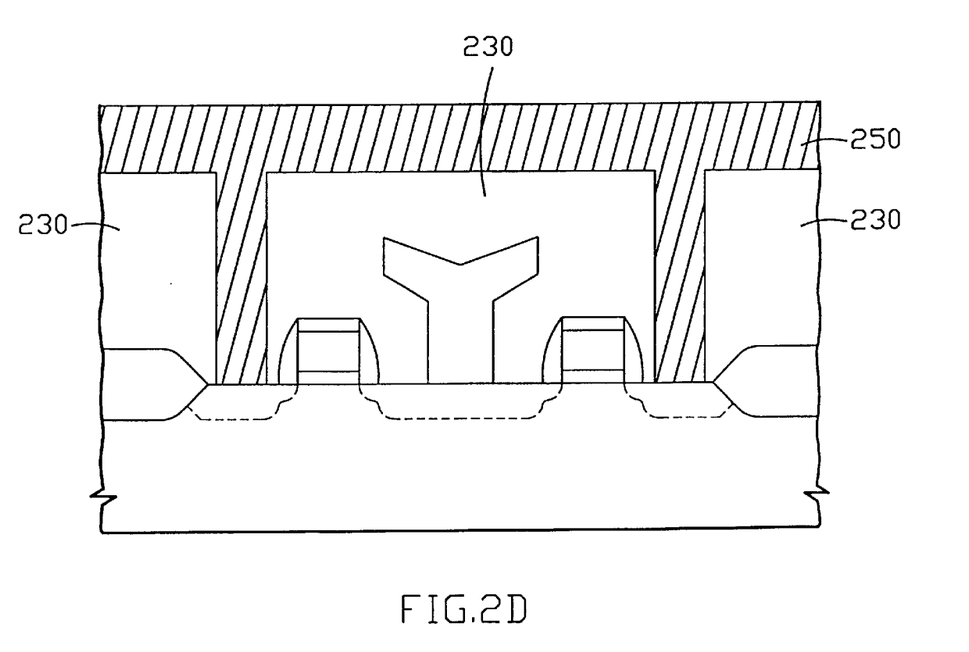

In FIG. 2C, the interlayer dielectric layer 230 is then dry etched to remove the part unprotected by the patterned photoresist layer, i.e. using the first patterned photoresist layer as a mask, to form a trench 245 and to expose a portion of the source region 215 in the semiconductor structure. After the formation of the trench 245, the remaining photoresist can then be stripped to expose the upper surface of the remaining interlayer dielectric layer. Sequentially, as shown in FIG. 2D, a first silicon layer 250 comprises amorphous-silicon (a-Si) is deposited over the interlayer dielectric layer 230 and filling up the trench in the interlayer dielectric layer.

Figure 2E:
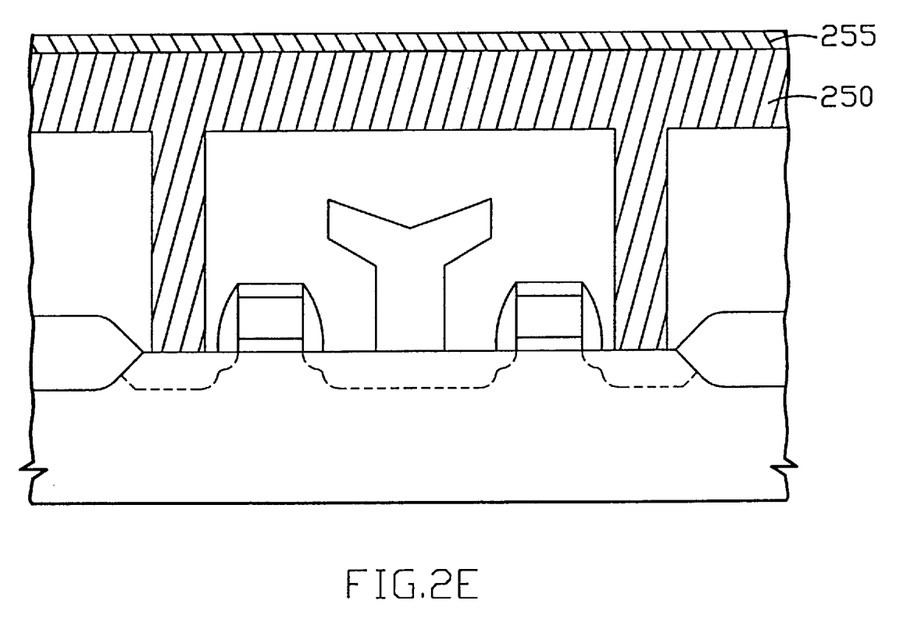

An anti-reflection film 255 comprises silicon oxynitride (SiON) is coated over and follows the formation of the first silicon layer 250, as what is shown in FIG. 2E, where it is simply used to serve as photo bottom anti-reflective coating (BARC) and etching hard mask for high aspect ratio capacitor patterns. The SiON film is formed by using plasma enhanced chemical vapor deposition (PECVD) at a temperature ranging from about 250° C. to about 400° C. and to a thickness ranging from about 200 to about 1000 angstroms.

Figure 2F:
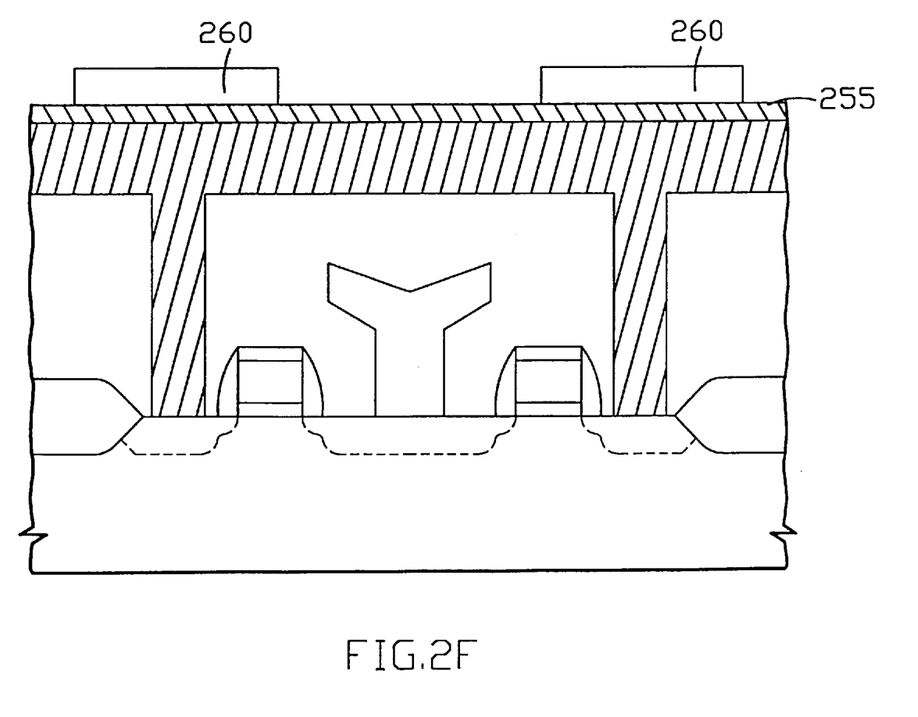
Figure 2G:
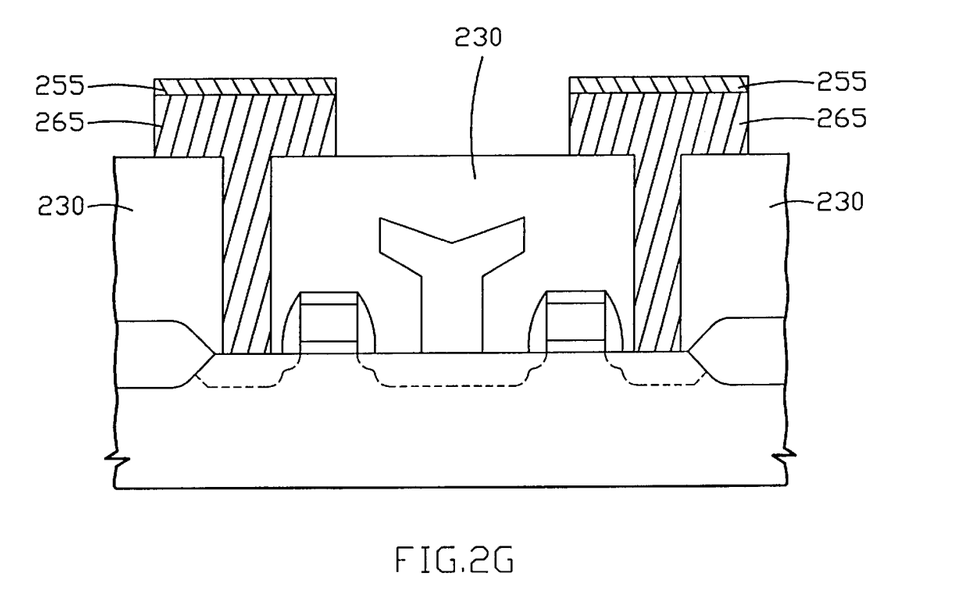
Figure 2H:
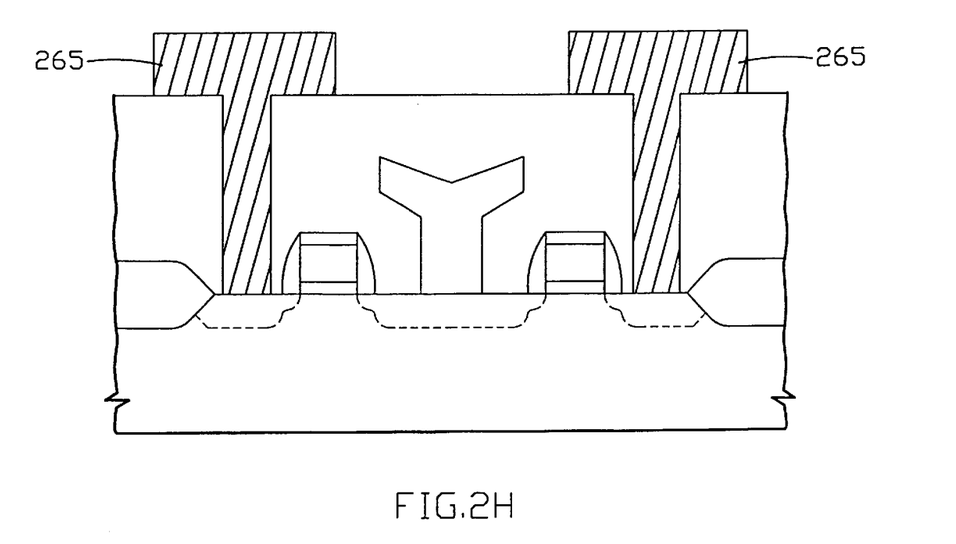

In FIG. 2F, a second patterned photoresist film 260 is formed on the SiON layer 255. This particular photoresist film is serving as a mask to etch the SiON layer and the first silicon layer, hence forming a lower capacitor electrode 265 and exposing a portion of the upper surface of the interlayer dielectric layer 230. The remaining photoresist is stripped off to expose the upper surface of the remaining SiON layer 255, where the resulting structure is shown in FIG. 2G. Now, referring to FIG. 2H, a wet etching method is applied to remove the SiON layer and to expose the entire upper surface of the lower capacitor electrode 265. The wet etching method comprises phosphoric acid ($H_3PO_4$) solution and is carried out at a temperature around 150° C. The removal of SiON by $H_3PO_4$ guaranties a perfect adhesion of selective-HSG onto amorphous-silicon surface.

Figure 2I:
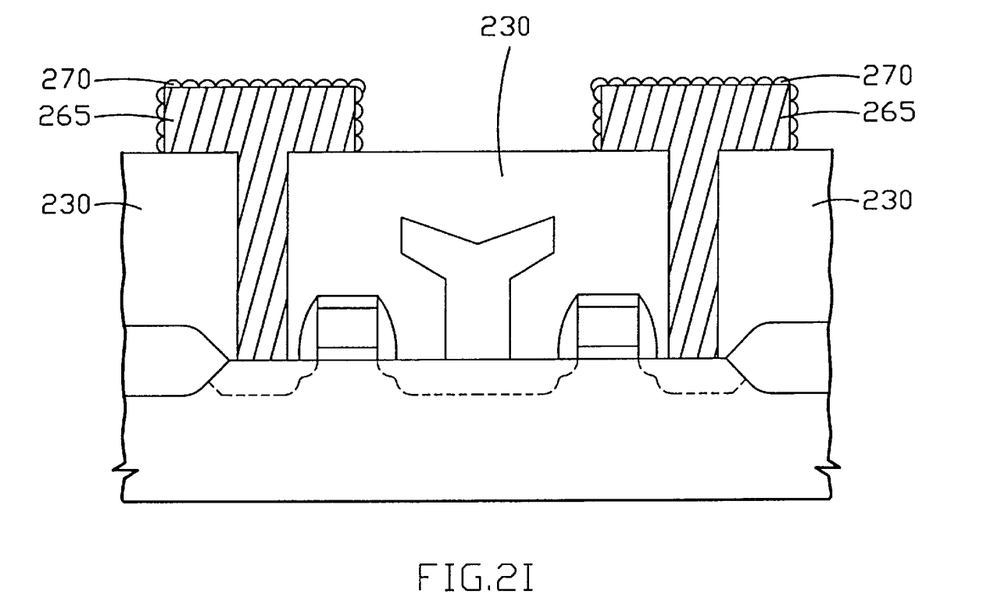
Figure 2J:
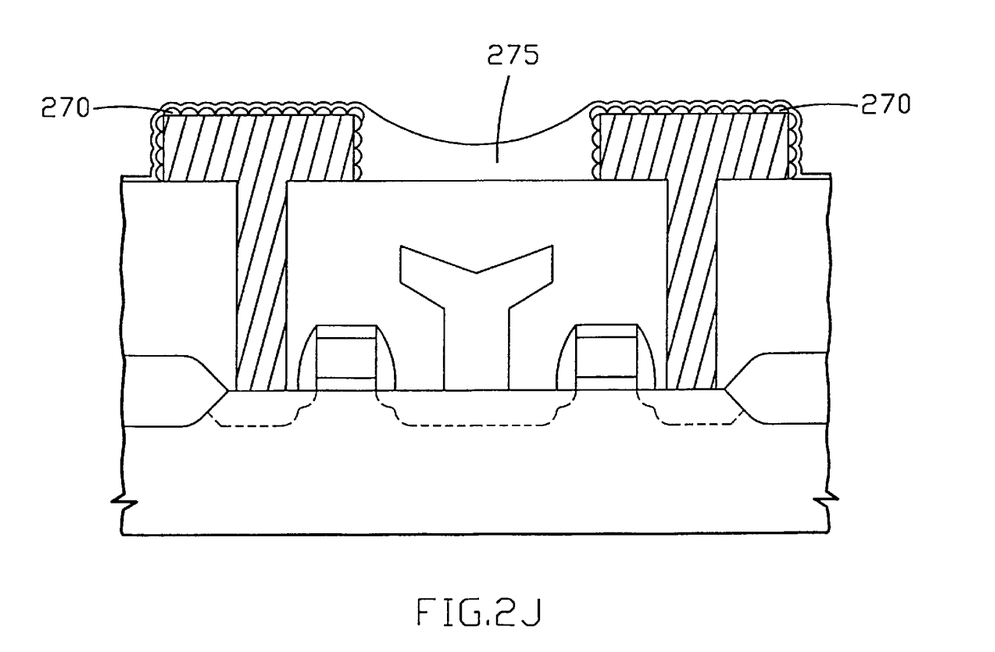
Figure 2K:
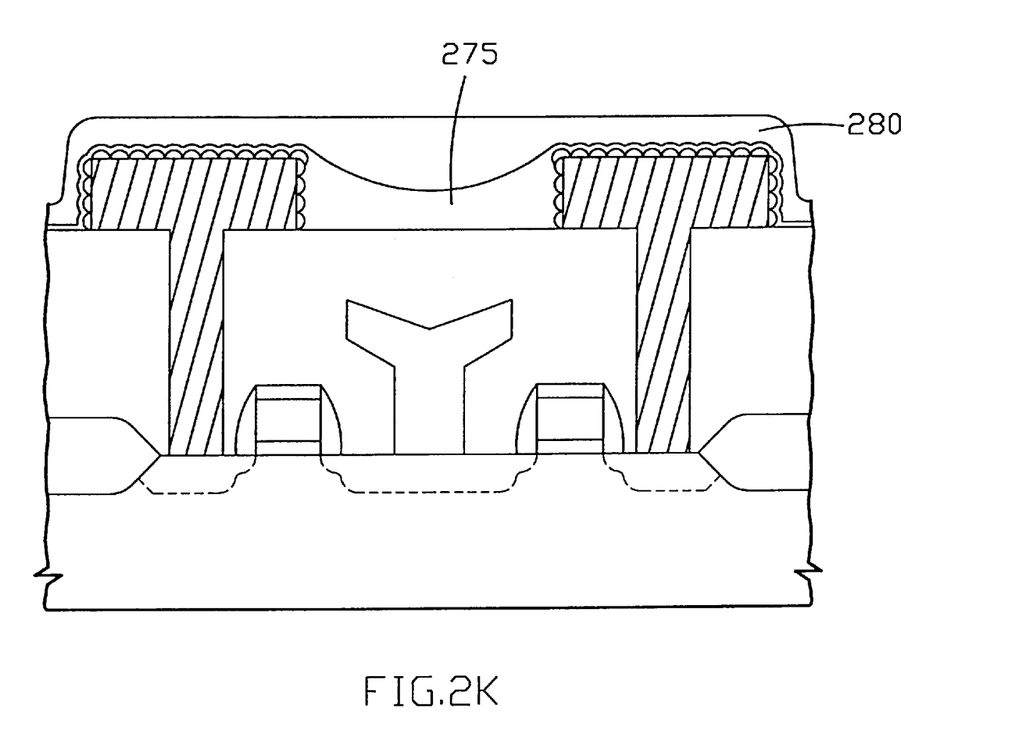

Referring to 2I, a selective hemispherical grain (s-HSG) silicon layer 270 is formed over the entire exposed surface of the lower capacitor electrode 265 and on a slight portion of the interlayer dielectric layer 230. Sequentially, shown in FIG. 2J, a conformal interpoly dielectric layer 275 is coated along a surface of the resulting structure and over said s-HSG silicon layer 270. This dielectric layer can be a double film of nitride-oxide layer, a triple film of oxide-nitride-oxide layer, a tantalum pentoxide ($Ta_2O_5$) layer, or any other insulator having a large dielectric constant. Finally, in FIG. 2K, a second silicon layer 280 comprises polysilicon is formed over the conformal interpoly dielectric layer 275 to serve as an upper capacitor electrode for the stack capacitor.

Although specific embodiments have been illustrated and described, it will be obvious to those skilled in the art that various modifications may be made without departing from what is intended to be limited solely by the appended claims.

What is claimed is:

1. A method of forming a capacitor, comprising the steps of:
   providing a semiconductor substrate having a semiconductor body formed thereon;
   forming a first insulating layer above said substrate and overlaying said semiconductor body;
   patterning said first insulating layer to define a contact hole for said capacitor;
   depositing an amorphous silicon layer as a first conductive layer over said first insulating layer and filling up said contact hole;
   forming a silicon oxynitride layer on said amorphous silicon layer to serve as photo bottom anti-reflective coating (BARC) and etching hard mask for capacitor patterns;
   patterning said silicon oxynitride layer and said amorphous silicon layer to form a lower capacitor electrode;
   removing said silicon oxynitride layer to expose the entire upper surface of said lower capacitor electrode, through a wet etching method utilizing phosphoric acid ($H_3PO_4$) solution at temperature about 150° C.;
   forming a selective hemispherical gram (s-HSG) silicon layer as a second conductive layer over the entire exposed surface of said lower capacitor electrode;
   forming a second insulating layer along a surface of the resulting structure and over said second conductive layer; and
   forming a third conductive layer over said second insulating layer serve as an upper capacitor electrode.

2. The method in accordance with claim 1, wherein said semiconductor body comprises a bit line, a gate electrode, a source region, a drain region, and an isolation region.

3. The method in accordance with claim 1, wherein said semiconductor substrate comprises silicon.

4. The method in accordance with claim 1, wherein said first insulating layer is an interlayer dielectric layer, which comprises silicon dioxide ($SiO_2$).

5. The method in accordance with claim 1, wherein said second insulating layer is a conformal interpoly dielectric layer, which comprises a double film of nitride-oxide layer.

6. The method in accordance with claim 1, wherein said second insulating layer is a conformal interpoly dielectric layer, which comprises a triple film of oxide-nitride-oxide layer.

7. The method in accordance with claim 1, wherein said second insulating layer is a conformal interpoly dielectric layer, which comprises tantalum pentoxide ($Ta_2O_5$).

8. The method in accordance with claim 1, wherein said s-HSG silicon layer is formed using a chemical vapor deposition process with a temperature ranging from about 500.degree.C. to about 600.degree. C.

9. The method in accordance with claim 1, wherein said third conductive layer comprises polysilicon.

10. The method in accordance with claim 1, wherein said silicon oxynitride layer is formed by using plasma enhanced chemical vapor deposition (PECVD) at a temperature ranging from about 250.degree.C. to about 400.degree.C.

11. The method in accordance with claim 10, wherein said silicon oxynitride layer has a thickness ranging from about 200 to about 1000 angstroms.

12. A method of forming a capacitor for a dynamic random access memory (DRAM) cell using a selective hemispherical grain (s-HSG) structure, said method comprising the steps of:
    providing a semiconductor substrate having a semiconductor structure formed thereon;
    forming an interlayer dielectric layer above said substrate and overlaying said semiconductor structure;
    forming a first patterned photoresist film on said interlayer dielectric layer;
    etching said interlayer dielectric layer by using said first patterned photoresist film as a mask, hence forming a contact hole and exposing a portion of an active area of said semiconductor structure;

stripping off said first patterned photoresist film;

depositing a first silicon layer over said interlayer dielectric layer and filling up said contact hole in said interlayer dielectric layer;

forming a silicon oxynitride layer on said first silicon layer to serve as photo bottom anti-reflective coating (BARC) and etching hard mask for capacitor patterns;

forming a second patterned photoresist film on said silicon oxynitride layer;

etching said silicon oxynitride layer and first silicon layer by using said second patterned photoresist film as a mask, hence forming a lower capacitor electrode and exposing a portion of the upper surface of said interlayer dielectric layer;

stripping off said second patterned photoresist film;

removing said silicon oxynitride layer and to expose the entire upper surface of said lower capacitor electrode through a wet etching method utilizing phosphoric acid ($H_3PO_4$) solution at temperature about 150° C.;

forming a selective hemispherical grain (s-HSG) silicon layer over the entire exposed surface of said lower capacitor electrode;

forming a conformal interpoly dielectric layer along a surface of the resulting structure and over said s-HSG silicon layer; and forming a second silicon layer over said conformal interpoly dielectric layer to serve as an upper capacitor electrode.

13. The method in accordance with claim 12, wherein said semiconductor structure comprises a bit line, a gate electrode, a source region, a drain region, and an isolation region.

14. The method in accordance with claim 12, wherein said semiconductor substrate comprises silicon.

15. The method in accordance with claim 12, wherein said interlayer dielectric layer comprises silicon dioxide ($SiO_2$).

16. The method in accordance with claim 12, wherein said conformal interpoly dielectric layer comprises a double film of nitride-oxide layer.

17. The method in accordance with claim 12, wherein said conformal interpoly dielectric layer comprises a triple film of oxide-nitride-oxide layer.

18. The method in accordance with claim 12, wherein said conformal interpoly dielectric layer comprises tantalum pentoxide ($Ta_2O_5$).

19. The method in accordance with claim 12, wherein said first silicon layer comprises amorphous silicon (a-Si).

20. The method in accordance with claim 12, wherein said s-HSG silicon layer is formed using a chemical vapor deposition process with a temperature ranging from about 500.degree.C. to about 600.degree.C.

21. The method in accordance with claim 12, wherein said second silicon layer comprises polysilicon.

22. The method in accordance with claim 12, wherein said silicon oxynitride layer is formed by using plasma enhanced chemical vapor deposition (PECVD) at a temperature ranging from about 250.degree.C. to about 400.degree.C.

23. The method in accordance with claim 22, wherein said silicon oxynitride layer has a thickness ranging from about 200 to about 1000 angstroms.

\* \* \* \* \*